United States Patent
Kim et al.

(10) Patent No.: US 10,781,371 B2
(45) Date of Patent: *Sep. 22, 2020

(54) ETCHANT COMPOSITION AND SILANE COMPOUND

(71) Applicants: SK Innovation Co., Ltd., Seoul (KR); SK-Materials Co., Ltd., Yeongju-si (KR)

(72) Inventors: Cheol Woo Kim, Daejeon (KR); Je Ho Lee, Daejeon (KR); Jin Su Ham, Daejeon (KR); Jae Hoon Kwak, Yeongju-si (KR); Jong Ho Lee, Yeongju-si (KR)

(73) Assignees: SK Innovation Co., Ltd., Seoul (KR); SK-Materials Co., Ltd., Yeongju-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/421,903

(22) Filed: May 24, 2019

(65) Prior Publication Data

US 2019/0359886 A1  Nov. 28, 2019

(30) Foreign Application Priority Data

May 26, 2018 (KR) .................. 10-2018-0060000

(51) Int. Cl.
*H01L 21/3213* (2006.01)
*H01L 21/311* (2006.01)
(Continued)

(52) U.S. Cl.
CPC .......... *C09K 13/06* (2013.01); *C07F 7/0834* (2013.01); *C07F 9/28* (2013.01); *C23F 1/00* (2013.01);
(Continued)

(58) Field of Classification Search
None
See application file for complete search history.

(56) References Cited

U.S. PATENT DOCUMENTS 8,252,863 B2  8/2012  Hasse et al.
8,840,798 B2  9/2014  Han et al.
(Continued)

FOREIGN PATENT DOCUMENTS

JP   2009-524715    7/2009
KR   10-2012-0068575  6/2012
(Continued)

OTHER PUBLICATIONS

N.F. Lazareva, et al., "The Reaction of N-methyl-N, N-bis-(silatranylmethyl)amine with dichloromethane", Russian Chemical Bulletin, International Edition, vol. 57, No. 10, Oct. 2008, pp. 2235-2236.

*Primary Examiner* — Stephanie P Duclair
(74) *Attorney, Agent, or Firm* — Oblon, McClelland, Maier & Neustadt, L.L.P.

(57) ABSTRACT

An etchant composition includes phosphoric acid and a silane compound represented by the following Chemical Formula 1:

[Chemical Formula 1]

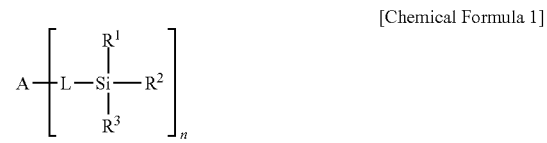

wherein A is an n-valent radical, L is $C_1$-$C_5$ hydrocarbylene, $R^1$ to $R^3$ are independently hydrogen, hydroxy, hydrocarbyl,
(Continued)

or alkoxy, in which R¹ to R³ exist respectively or are connected to each other by a heteroelement, and n is an integer of 2 to 5.

16 Claims, 1 Drawing Sheet

(51) Int. Cl.
| | |
|---|---|
| *H01L 21/306* | (2006.01) |
| *H01L 21/04* | (2006.01) |
| *C23F 1/16* | (2006.01) |
| *C23F 1/14* | (2006.01) |
| *C23F 1/00* | (2006.01) |
| *C09K 13/06* | (2006.01) |
| *C07F 9/6596* | (2006.01) |
| *C07F 9/6561* | (2006.01) |
| *C07F 9/53* | (2006.01) |
| *C07F 9/50* | (2006.01) |
| *C07F 9/28* | (2006.01) |
| *C07F 7/18* | (2006.01) |
| *C07F 7/08* | (2006.01) |

(52) U.S. Cl.
CPC ............. *C23F 1/14* (2013.01); *C23F 1/16* (2013.01); *H01L 21/042* (2013.01); *H01L 21/30604* (2013.01); *H01L 21/311* (2013.01); *H01L 21/31111* (2013.01); *H01L 21/32134* (2013.01)

(56) References Cited

U.S. PATENT DOCUMENTS

| | | | |
|---|---|---|---|
| 2009/0081927 A1 | 3/2009 | Grumbine et al. | |
| 2013/0092872 A1* | 4/2013 | Hong | H01L 21/02658 252/79.4 |
| 2013/0313225 A1 | 11/2013 | Jin et al. | |
| 2015/0348799 A1* | 12/2015 | Hong | H01L 29/66825 438/268 |

FOREIGN PATENT DOCUMENTS

| | | |
|---|---|---|
| KR | 10-2013-0076918 | 7/2013 |
| KR | 10-2016-0010267 | 1/2016 |
| KR | 10-2017-0066180 | 6/2017 |
| KR | 10-1743101 B2 | 6/2017 |
| KR | 10-1828437 B1 | 3/2018 |
| KR | 10-2018-0075416 | 7/2018 |
| WO | WO 2008/080096 A2 | 7/2008 |
| WO | WO 2017/095022 A1 | 6/2017 |

\* cited by examiner

ETCHANT COMPOSITION AND SILANE COMPOUND

CROSS-REFERENCE TO RELATED APPLICATION(S)

This application claims benefit of priority to Korean Patent Application No. 10-2018-0060000 filed on May 26, 2018 in the Korean Intellectual Property Office, the disclosure of which is incorporated herein by reference in its entirety.

BACKGROUND

1. Field

The present disclosure relates an etchant composition, and more particularly, to an etchant composition having a high selection ratio which may selectively remove a nitride film while minimizing an etching rate of an oxide film. In addition, the present disclosure relates a silane compound appropriate for use as an additive of the etchant composition.

2. Description of Related Art

An oxide film such as a silicon oxide ($SiO_2$) film and a nitride film such as a silicon nitride (SiNx) film are representative insulating films, and in a semiconductor manufacturing process, the silicon oxide film or the silicon nitride film is used alone or in the form of a laminate in which one or more films are alternately stacked. In addition, the oxide film or the nitride film is also used as a hard mask for forming a conductive pattern such as metal wiring.

In a wet etching process for removing the nitride film, a mixture of phosphoric acid and deionized water is generally used. The deionized water is added for preventing a decrease of an etching rate and a change in etching selectivity to an oxide film; however, there is a problem in that defects arise in a nitride film etching removal process even with a minute change in an amount of supplied deionized water. In addition, phosphoric acid is a strong acid and corrosive, thereby having a difficulty in handling.

In order to solve the problem, there is conventionally known a technology for removing a nitride film using an etchant composition including fluoric acid (HF), nitric acid ($HNO_3$) or the like in phosphoric acid ($H_3PO_4$), but causing a result of inhibiting an etching selection ratio of the nitride film and the oxide film. In addition, there is also known a technology of using an etchant composition including phosphoric acid and a silicate or silicic acid; however, the silicic acid or silicate has a problem of causing particles which may affect a substrate, thereby being rather inappropriate for a semiconductor manufacturing process.

Meanwhile, when phosphoric acid is used in a wet etching process for removing the nitride film, not only the nitride film but also an SOD oxide film is etched due to a reduced etching selection ratio between the nitride film and the oxide film, whereby it is difficult to adjust an effective field oxide height (EFH). Accordingly, a sufficient wet etching time for removing the nitride film may not be secured, or an additional process is needed, which causes a change and has a bad influence on device characteristics.

Therefore, an etchant composition having a high selection ratio, which selectively etches a nitride film to an oxide film and does not have a problem such as particle occurrence in a semiconductor manufacturing process, is currently demanded.

SUMMARY

An aspect of the present disclosure may provide an etchant composition having a high selection ratio, which may selectively remove a nitride film while minimizing an etching rate of an oxide film, and does not have problems such as particle occurrence having a bad influence on device characteristics, and a silane compound used in the etchant composition.

According to an aspect of the present disclosure, an etchant composition may include phosphoric acid and a silane compound represented by the following Chemical Formula 1:

[Chemical Formula 1]

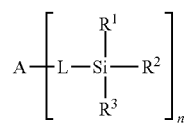

wherein A an n-valent radical, L is $C_1$-$C_5$ hydrocarbylene, $R^1$ to $R^3$ are independently hydrogen, hydroxy, hydrocarbyl, or alkoxy, in which $R^1$ to $R^3$ exist respectively or are connected to each other by a heteroelement, and n is an integer of 2 to 5.

According to an exemplary embodiment, the etchant composition wherein $R^1$ to $R^3$ are independently $C_1$-$C_{20}$ alkoxy or $R^1$ to $R^3$ are $C_1$-$C_{20}$ alkoxy connected to each other by a nitrogen, is provided.

According to an exemplary embodiment, the etchant composition wherein A is $C_1$-$C_{20}$ hydrocarbylene, a radical having N as a binding site, a radical having O as a binding site, a radical having S as a binding site, a radical having P as a binding site, or an amine salt radical, is provided.

According to an exemplary embodiment, the etchant composition wherein $C_1$-$C_{20}$ hydrocarbylene is $C_1$-$C_{20}$ alkylene or $C_6$-$C_{20}$ arylene, is provided.

In an exemplary embodiment, the etchant composition wherein the radical having N as a binding site is *—$NR^{14}$—*, *—$NR^{15}CSNR^{16}$—*, *—$NR^{17}CONR^{18}$—*, *—$NR^{19}L_1NR^{20}$—*, *—$NR^{21}CONR^{22}L_2NR^{23}$CONR^{24}$—*, *—$NR^{25}CONL_3L_4NCONR^{26}$—*,

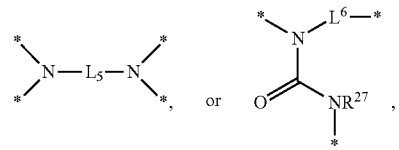

is provided, wherein $R^{14}$ to $R^{27}$ are independently hydrogen, $C_1$-$C_{20}$ alkyl or $C_6$-$C_{20}$ aryl, $L_1$ to $L_5$ are $C_1$-$C_{20}$ alkylene, $C_6$-$C_{20}$ arylene, or $R^{41}(OR^{42})p$, wherein $R^{41}$ and $R^{42}$ are independently $C_1$-$C_{20}$ alkylene, p is an integer of 1 to 5, $L_6$ is a direct bond or $(CH_2)qNR^{43}NR^{44}$, wherein $R^{43}$ and $R^{44}$ are independently hydrogen, $C_1$-$C_{20}$ alkyl, or $C_6$-$C_{20}$ aryl, and q is an integer of 1 to 5.

In an exemplary embodiment, the etchant composition wherein the radical having O as a binding site is *—O—*, is provided.

In an exemplary embodiment, the etchant composition wherein the radical having S as a binding site is *—S—*, *—S—S—*,

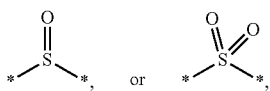

is provided.

In an exemplary embodiment, the etchant composition wherein the radical having P as a binding site is

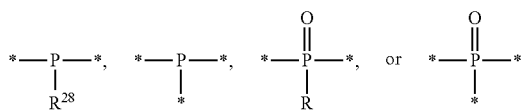

is provided, wherein $R^{28}$ and $R^{29}$ are independently hydrogen, $C_1$-$C_{20}$ alkyl, $C_6$-$C_{20}$ aryl, $C_1$-$C_{20}$ alkoxy, or $(C_1$-$C_{20})$ alkyl $(C_1$-$C_{20})$ alkoxy.

In an exemplary embodiment, the etchant composition wherein the amine salt radical is *—N$^+$(R$^{11}$R$^{12}$)X$_3^-$—* or

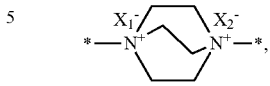

is provided, wherein $R^{11}$ and $R^{12}$ are independently hydrogen, $C_1$-$C_{20}$ alkyl or $C_6$-$C_{20}$ aryl, and $X_1$ to $X_3$ are independently of one another halogen or a $C_1$-$C_{20}$ alkylcarbonate group.

In an exemplary embodiment, the etchant composition wherein n is 2, is provided.

In an exemplary embodiment, the etchant composition wherein the silane compound is at least one selected from the following Structural Formulae 1 to 38, is provided:

(1)
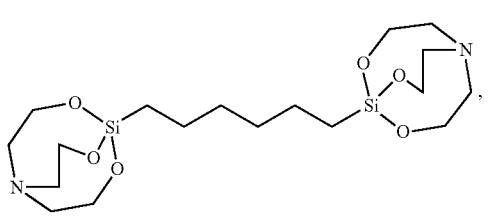

(2)
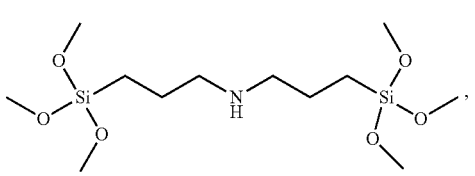

(3)
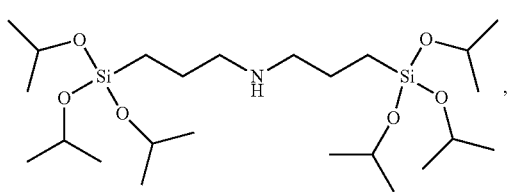

(4)
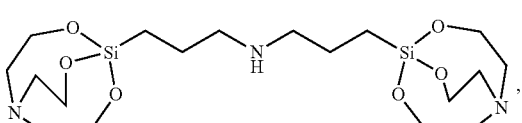

(5)
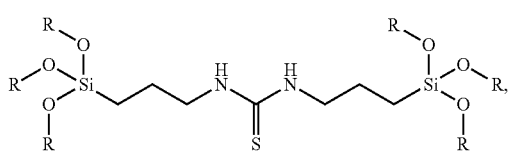

(6)
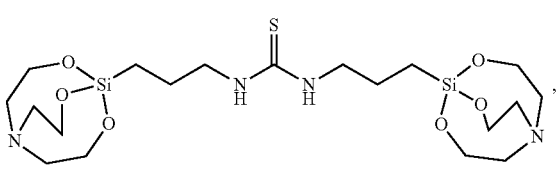

(7)
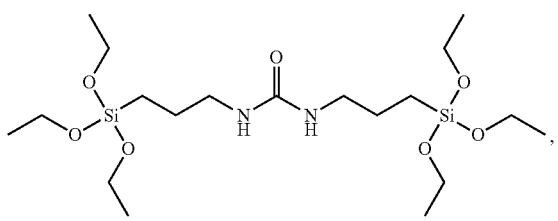

(8)
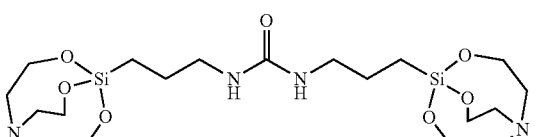

(9)
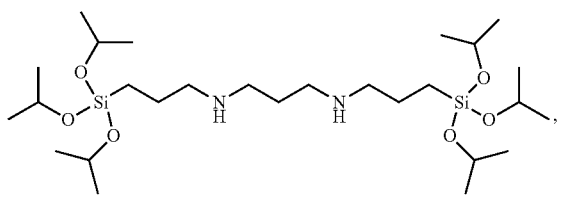

(10)
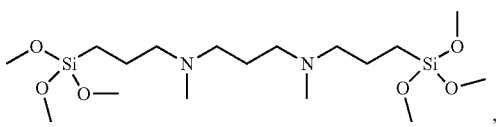

-continued
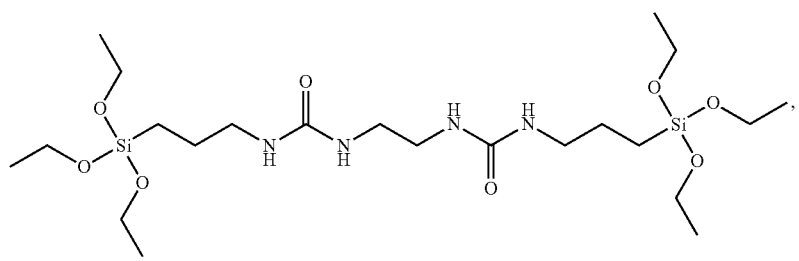
(11)
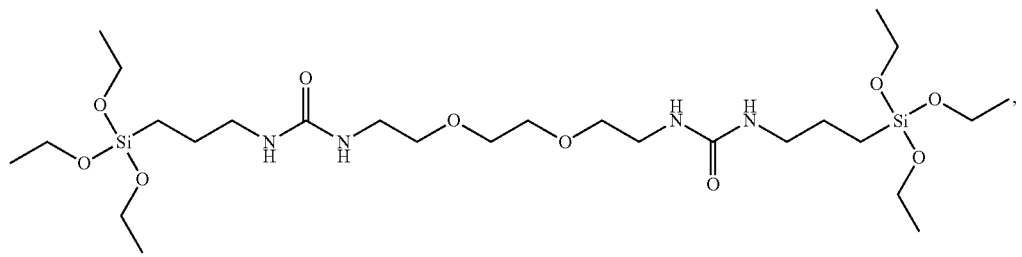
(12)
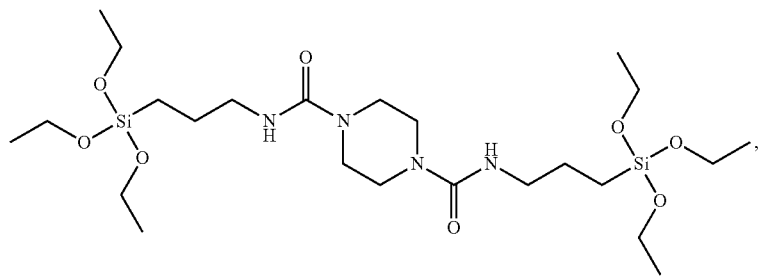
(13)
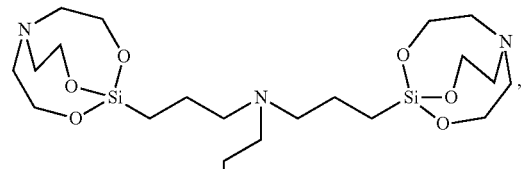
(14)
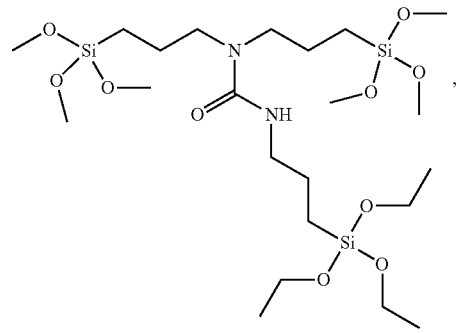
(15)
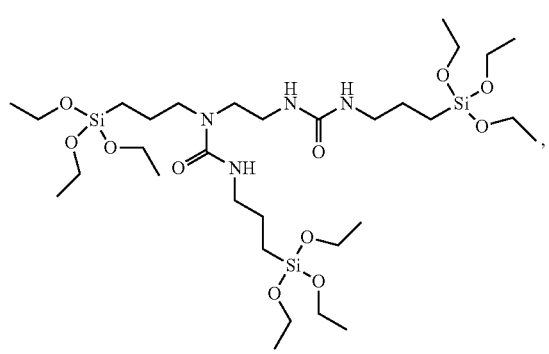
(16)
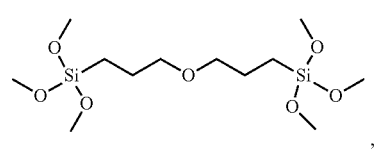
(17)

-continued
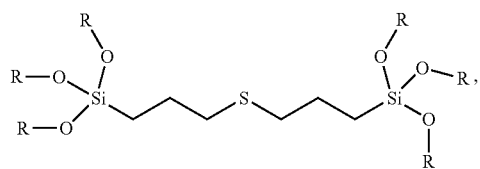(18) 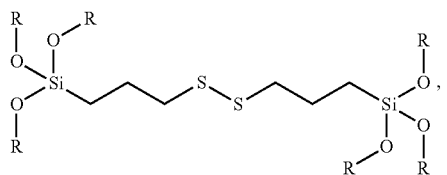(19)
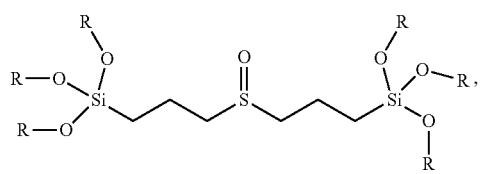(20) 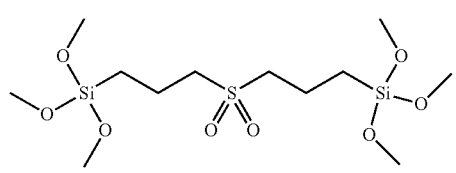(21)
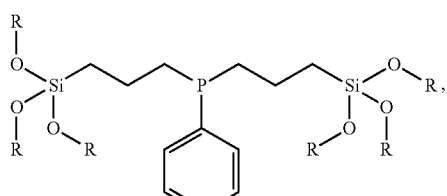(22) 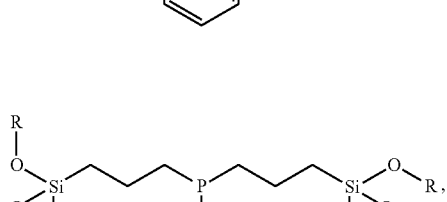(23)
(24) (25)
(26) (27)
(28) (29)
(30) (31)

-continued

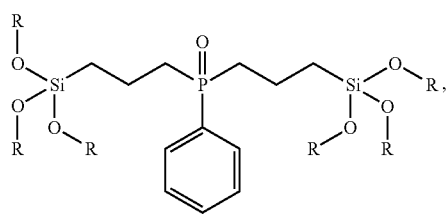
(32)

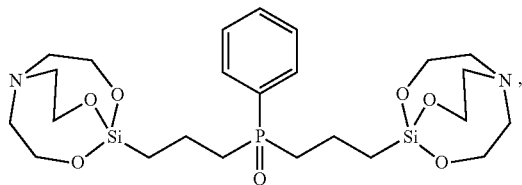
(33)

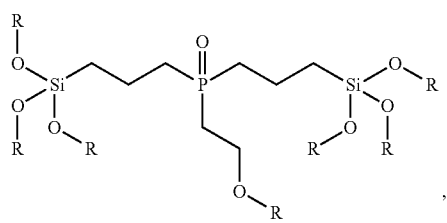
(34)

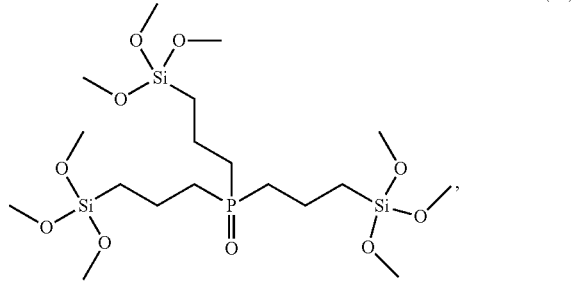
(35)

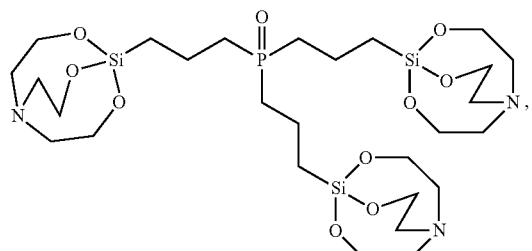
(36)

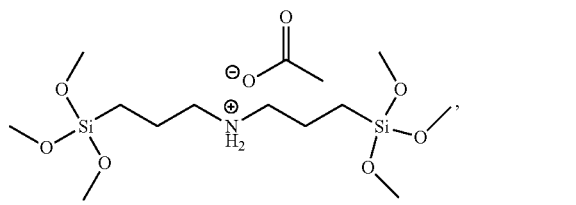
(37)

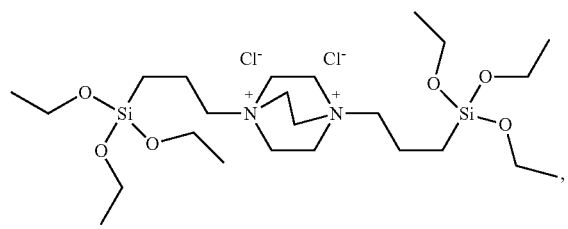
(38)

wherein R is hydrogen, $C_1$-$C_{20}$ alkyl, or $C_6$-$C_{20}$ aryl.

In an exemplary embodiment, the etchant composition wherein the silane compound is included at 0.001 to 1 wt %, with respect to the entire etchant composition, is provided.

In an exemplary embodiment, the etchant composition further including a silane compound represented by the following Chemical Formula 2, is provided:

[Chemical Formula 2]

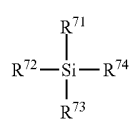

wherein $R^{71}$ to $R^{74}$ are independently hydrogen, hydrocarbyl, or heterohydrocarbyl.

In an exemplary embodiment, an etchant composition further including an ammonium salt is provided.

According to another aspect of the present disclosure, a silane compound represented by the following Chemical Formula 1, as an additive to the etchant composition, is provided:

[Chemical Formula 1]

$$A \!-\!\!\left[\!L\!-\!\underset{\underset{R^3}{|}}{\overset{\overset{R^1}{|}}{Si}}\!-\!R^2\right]_n$$

wherein $R^1$ to $R^3$ are independently hydrogen, hydroxy, hydrocarbyl, or alkoxy, in which $R^1$ to $R^3$ exist respectively or are connected to each other by a heteroelement, L is $C_1$-$C_5$ hydrocarbylene, n is an integer of 2 to 4, and A is
*—$N^+R^{11}R^{12}X_3^-$—*,

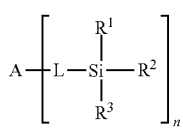

*—$NR^{19}L_1NR^{20}$—*,     *—$NR^{21}CONR^{22}L_2NR^{23}CONR^{24}$—*,

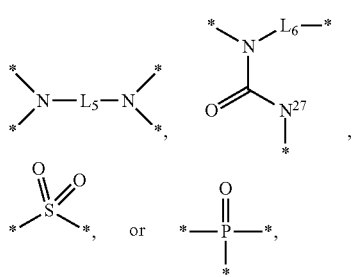

wherein $RR^{11}$, $R^{12}$, $R^{19}$ to $R^{24}$, and $R^{27}$ are independently hydrogen, $C_1$-$C_{20}$ alkyl and $C_6$-$C_{20}$ aryl, $X_1$ to $X_3$ are independently halogen or a $C_1$-$C_{20}$ alkylcarbonate group, $L_1$ and $L_5$ are $C_1$-$C_{20}$ alkylene or $C_6$-$C_{20}$ arylene, $L_2$ is $C_1$-$C_{20}$ alkylene, $C_6$-$C_{20}$ arylene, or $R^{41}(OR^{42})_p$, wherein $R^{41}$ and $R^{42}$ are $C_1$-$C_{20}$ alkylene, p is an integer of 1 to 5, and $L_6$ is a direct bond or $(CH_2)_q NR^{43}CONR^{44}$, wherein $R^{43}$ and $R^{44}$ are independently hydrogen, $C_1$-$C_{20}$ alkyl, or $C_6$-$C_{20}$ aryl, and q is an integer of 1 to 5.

In another exemplary embodiment, the silane compound represented by Chemical Formula 1 which is selected from the compounds represented by the following structural formulae is provided:

(9)
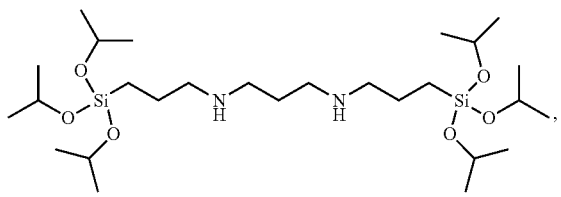

(10)
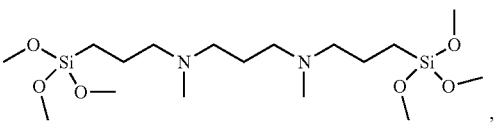

(12)
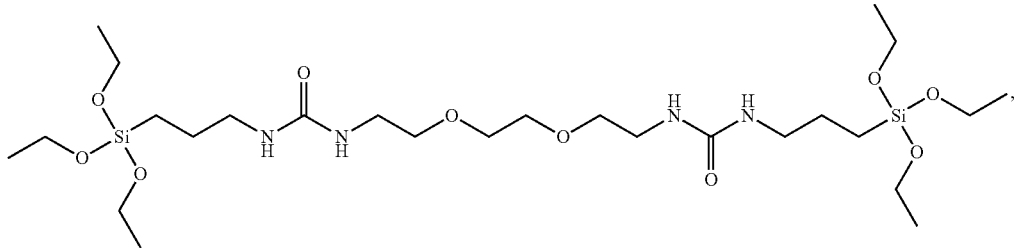

(14)
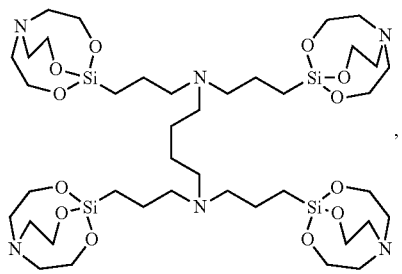

(16)
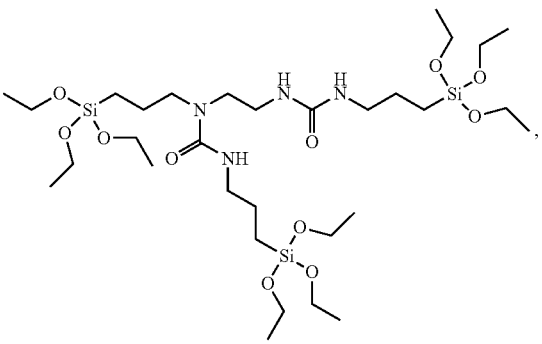

(24)
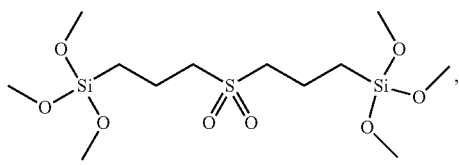

(25)
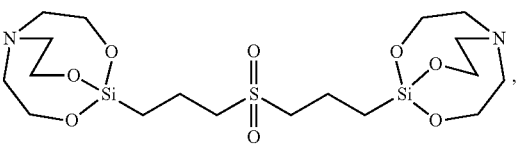

(35)
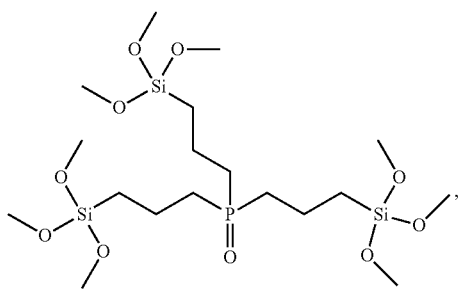

(37)
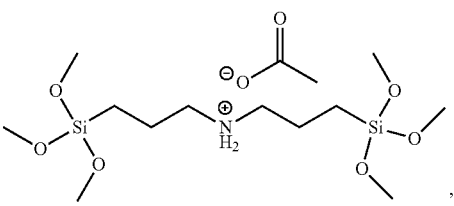

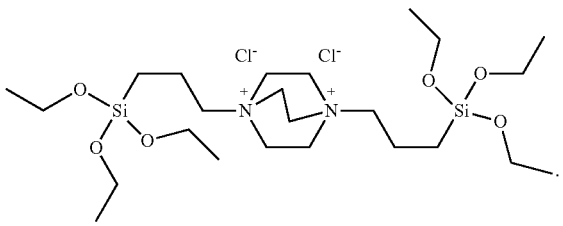

(38)

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
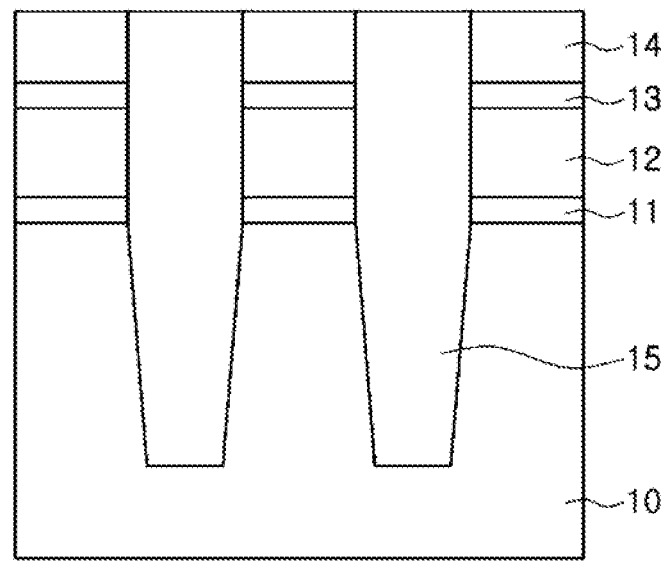
FIGS. 1 and 2 are process sectional views showing a device separation process of a flash memory device.

Hereinafter, exemplary embodiments in the present disclosure will now be described in detail with reference to the accompanying drawings.

Since the present disclosure maybe variously modified and have several exemplary embodiments, specific exemplary embodiments will be shown in the embodiment and be described in detail in the detailed description. However, it is to be understood that the present disclosure is not limited to a specific exemplary embodiment, but includes all modifications, equivalents, and substitutions without departing from the scope and spirit of the present disclosure.

Terms used in the present disclosure are used only in order to describe specific exemplary embodiments rather than limiting the present disclosure. Singular forms are intended to include plural forms unless otherwise indicated contextually. It will be further understood that the terms "comprises" or "have" used in this specification, specify the presence of stated features, steps, operations, components, parts, or a combination thereof, but do not preclude the presence or addition of one or more other features, numerals, steps, operations, components, parts, or a combination thereof.

An etchant composition according to an exemplary embodiment of the present disclosure includes phosphoric acid and a silane compound.

The phosphoric acid may be reacted with silicon nitride to etch the nitride. The silicon nitride and the phosphoric acid may be reacted as shown in the following formula and etched:

$$3Si_3N_4 + 27H_2O + 4H_3PO_4 \rightarrow 4(NH_4)_3PO_4 + 9SiO_2H_2O \quad (1)$$

The phosphoric acid may be, for example, an aqueous phosphoric acid solution containing the phosphoric acid at a concentration of 80%, but not limited thereto. Water to be used in the aqueous phosphoric acid solution is not particularly limited, but is preferably deionized water.

The silane compound may be represented by the following Chemical Formula 1:

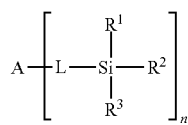

[Chemical Formula 1]

In Chemical Formula 1, $R^1$ to $R^3$ may be independently hydrogen, hydroxy, hydrocarbyl, or alkoxy, in which $R^1$ to $R^3$ may exist respectively or may be connected to each other by a heteroelement. More specifically, $R^1$ to $R^3$ may be independently $C_1$-$C_{20}$ alkoxy or $C_1$-$C_{20}$ alkoxy connected to each other by nitrogen as a heteroelement.

L may be a direct bond or $C_1$-$C_3$ hydrocarbylene, more specifically $C_1$-$C_3$ alkylene.

Furthermore, n may be an integer of 2 to 4.

A represents an n-valent radical. For example, A may be hydrocarbylene, a radical having N as a binding site, a radical having O as a binding site, a radical having S as a binding site, a radical having P as a binding site, an amine salt radical, or the like.

The hydrocarbylene may be $C_1$-$C_{20}$ alkylene or $C_6$-$C_{20}$ arylene, and more specifically, for example, $(CH_2)_2$, $(CH_2)_6$, phenylene, or the like. In this case, n is an integer of 2.

When A is the radical having N as a binding site, A may be for example, *—$NR^{14}$—* such as *—NH—*, *—$NR^{15}CSNR^{16}$—* such as *—NHCSNH—*, *—$NR^{17}CONR^{18}$—* such as *—NHCONH—*, *—$NR^{19}L_1NR^{20}$—* such as *—$NH(CH_2)_3NH$—* or *—$NCH_3(CH_2)_3NCH_3$—*, *—$NR^{21}CONR^{22}L_2NR^{23}CONR^{24}$—* such as *—$NHCONH(CH_2)_2NHCONH$—*, *—$NHCONH(C_6H_4)NHCONH$—*, or *—$NHCONH(CH_2)_2O(CH_2)_2O(CH_2)_2NHCONH$—*, *—$NR^{25}CONL_3L_4NCONR^{26}$—* such as *—$NHCON(CH_2)_2(CH_2)_2NCONH$—*, or the like, as the case that n is an integer of 2. In addition, A may be,

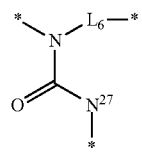

as the case that n is an integer 3. Furthermore, A may be

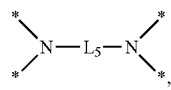

as the case that n is an integer of 4.

Herein, $R^{14}$ to $R^{27}$ are independently hydrogen, $C_1$-$C_{20}$ alkyl, or $C_6$-$C_{20}$ aryl, $L_1$ to $L_5$ are $C_1$-$C_{20}$ alkylene, $C_6$-$C_{20}$ arylene, or $R^{41}(OR^{42})p$, wherein $R^{41}$ and $R^{42}$ are independently $C_1$-$C_{20}$ alkylene, p is an integer of 1 to 5, $L_6$ is a direct bond or $(CH_2)_q NR^{43}NR^{44}$, wherein $R^{43}$ and $R^{44}$ are independently hydrogen, $C_1$-$C_{20}$ alkyl, or $C_1$-$C_{20}$ aryl, and q is an integer of 1 to 5.

The radical having O as a binding site may be for example, *—O—*, and in this case, n is an integer of 2.

The radical having S as a binding site may be for example, *—S—*, *—S—S—*,

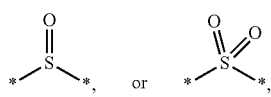

and in this case, n is an integer of 2.

Meanwhile, the radical having P as a binding site may be for example,

and in this case, n is an integer of 2 or 3, wherein $R^{28}$ and $R^{29}$ may be independently hydrogen, $C_1$-$C_{20}$ alkyl, $C_6$-$C_{20}$ aryl, $C_1$-$C_{20}$alkoxy, or $(C_1$-$C_{20})$ alkyl $(C_1$-$C_{20})$ alkoxy.

Furthermore, A may be an amine salt radical, and specifically *—$N^+(R^{11}R^{12})X_3^-$—* or

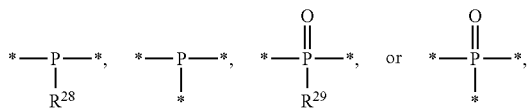

and n is an integer of 2, wherein $R^{11}$ and $R^{12}$ may be independently hydrogen, $C_1$-$C_{20}$ alkyl or $C_6$-$C_{20}$ aryl, and $X_1$ to $X_3$ may be independently halogen or a $C_1$-$C_{20}$ alkylcarbonate group.

The silane compound represented by Chemical Formula 1 as described above may be for example, silane compounds shown below:

(1)
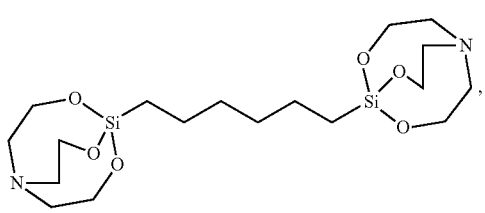

(2)
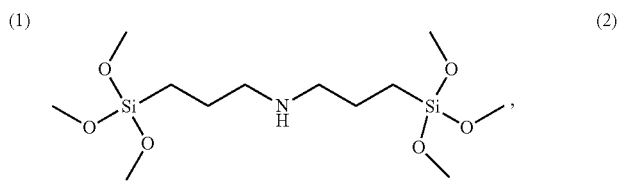

(3)
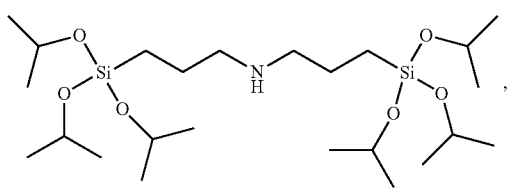

(4)
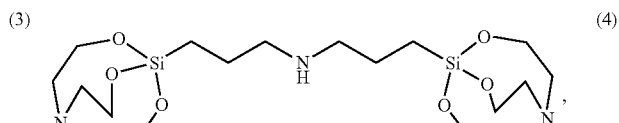

(5)
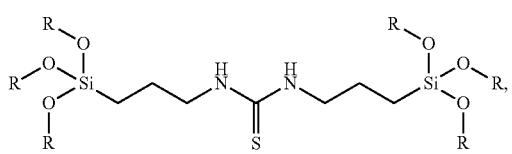

(6)
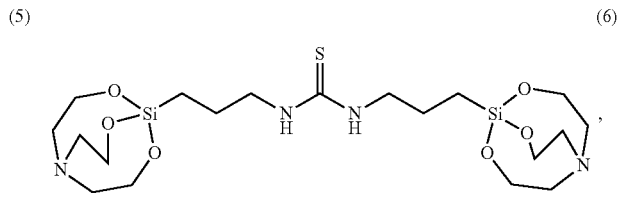

(7)
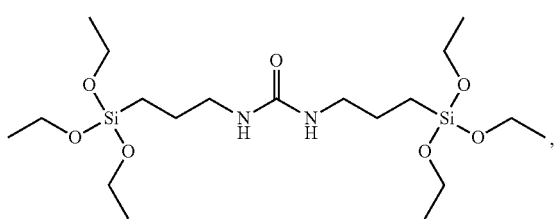

(8)
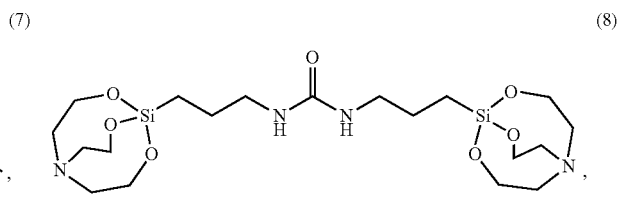

-continued
(9)
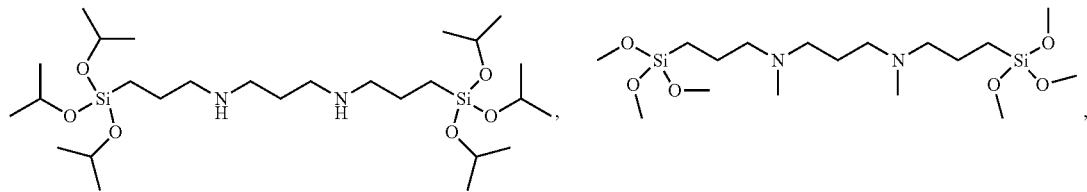
(10)
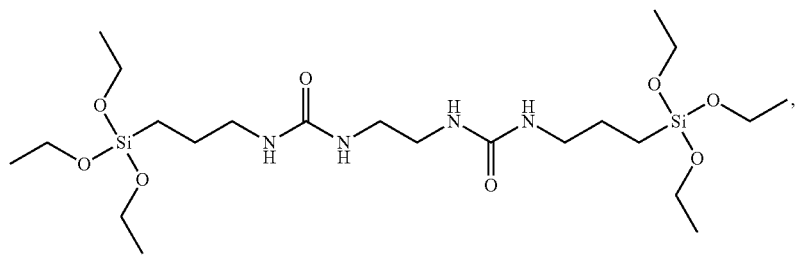
(11)
(12)
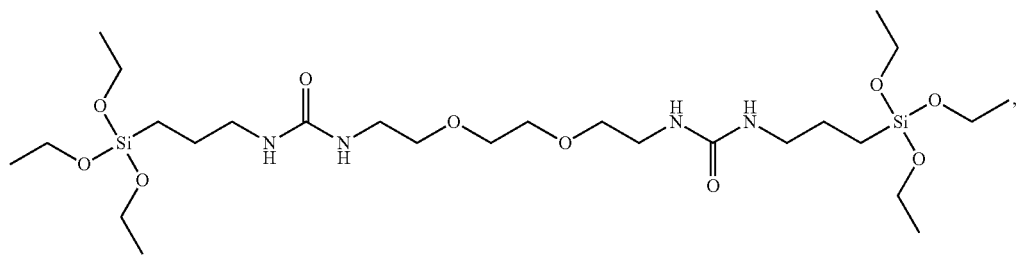
(13)
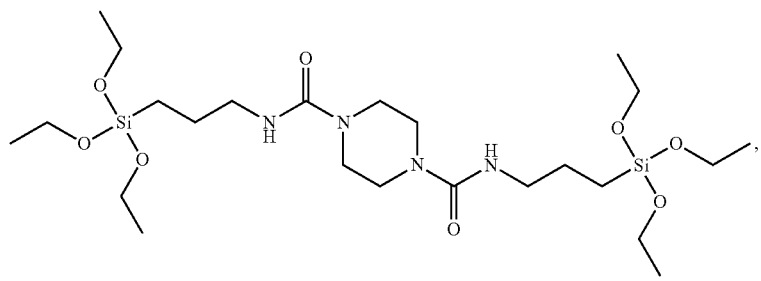
(14)
(15)
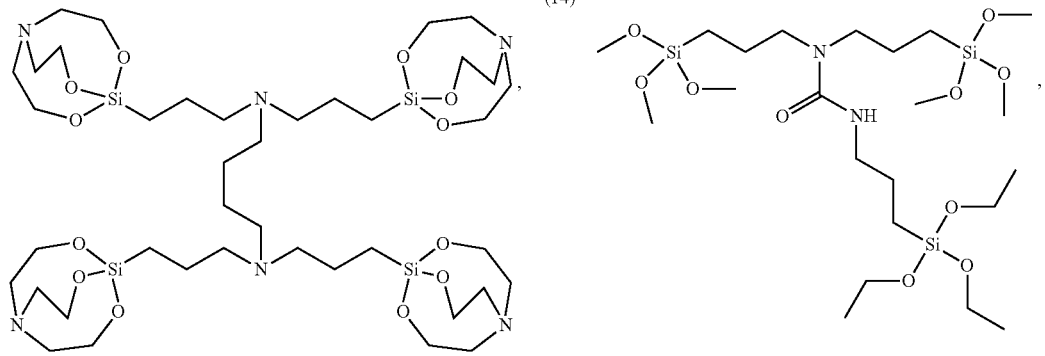

-continued
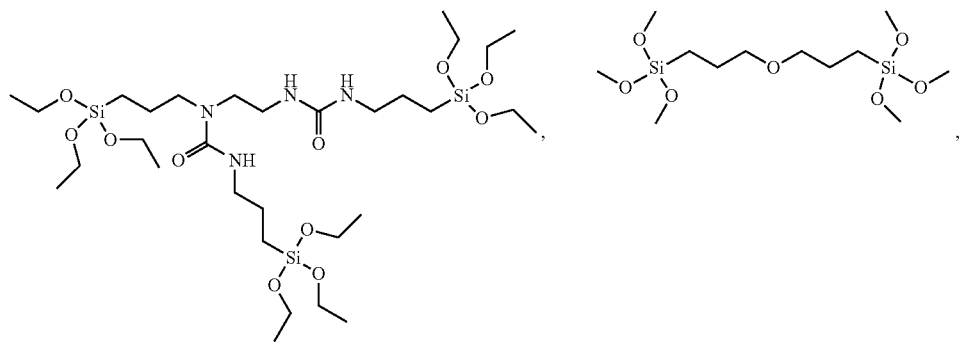
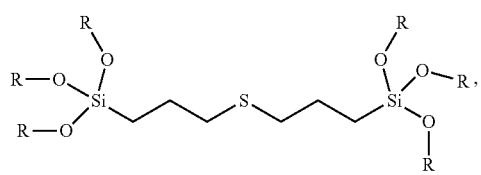
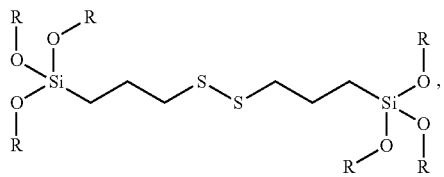
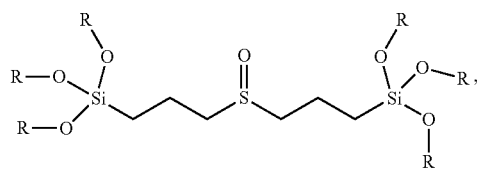
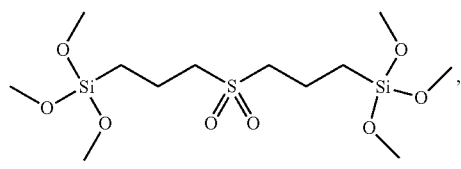
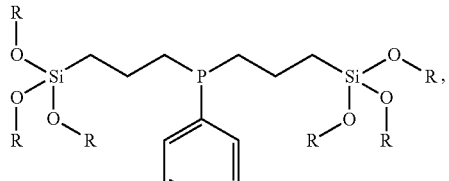
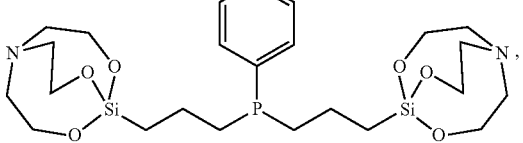
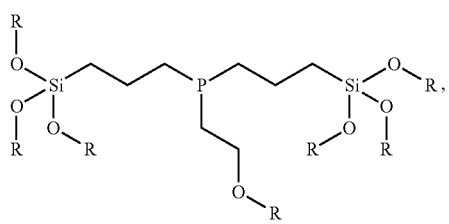
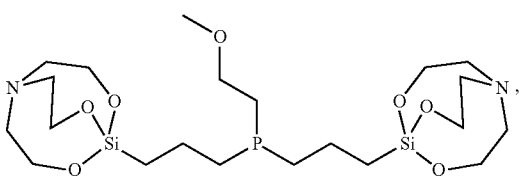

-continued

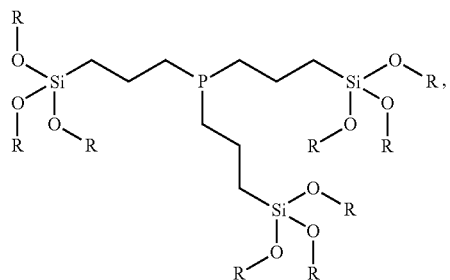

(30)

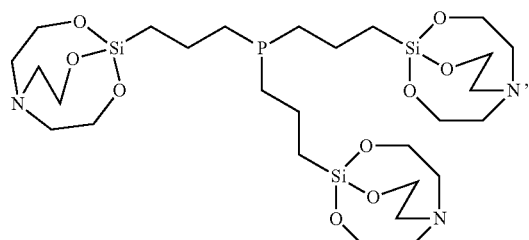

(31)

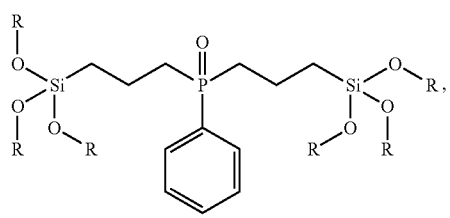

(32)

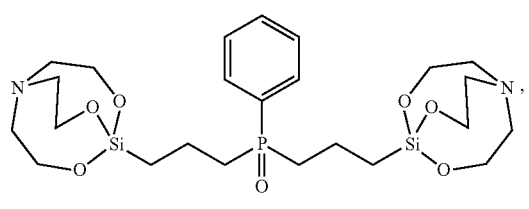

(33)

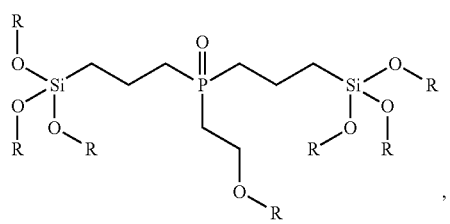

(34)

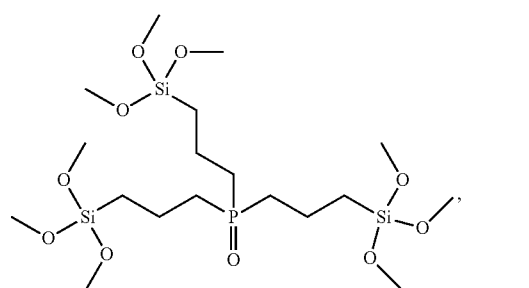

(35)

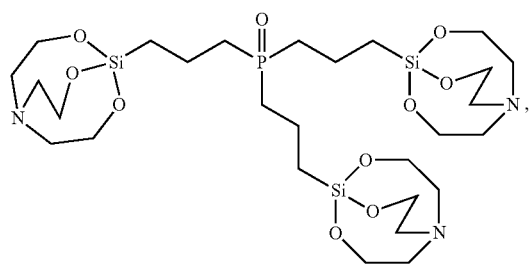

(36)

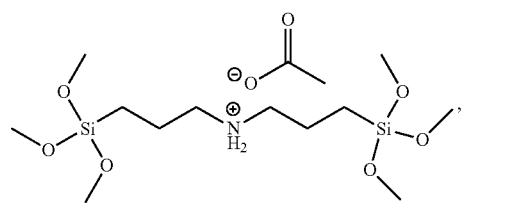

(37)

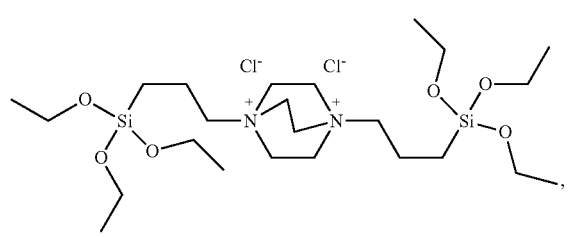

(38)

wherein R is hydrogen, $C_1$-$C_{20}$ alkyl, or $C_6$-$C_{20}$ aryl.

The silane compound as described above has two or more silanes, thereby reacting with an oxide film to form a protective film on the surface of the oxide film, which suppresses etching of the oxide film by phosphoric acid. Accordingly, when a nitride film is removed by etching by phosphoric acid, the silane compound may be appropriately used as an etchant additive for improving selectivity of the nitride film to the oxide film.

Oxygens included in the silane compound are bonded to the surface of the oxide film to protect the oxide film, and may be hydrogen-bonded to the surface of the oxide film, thereby minimizing etching of the oxide film during etching of a nitride in the etchant composition. Particularly, the silane compound provided in the present disclosure has two or more silane groups, thereby having a high bonding property to the surface of the oxide film to further increase etch selectivity of the nitride to the oxide film. Accordingly, the etchant including the silane compound of the present disclosure may improve selectivity to the nitride film while minimizing an etching rate of the oxide film.

Meanwhile, in the above Formula (1), $SiO_2H_2O$ may be precipitated on the surface of the oxide film to increase a thickness of the oxide film. The phenomenon is referred to as abnormal growth. In particular, when the phenomenon proceeds by accumulation of the etching process of the nitride in the etchant composition, a concentration of $SiO_2H_2O$ in the etchant composition may be increased, and the increased concentration of $SSiO_2H_2O$ causes an increase in incidence of the abnormal growth That is, even in the case that the abnormal growth by $SiO_2H_2O$ does not occur in the initial etchant composition, the incidence of the abnormal growth increases with the increased number of accumulated processes. However, when the silane compound according to the present disclosure is included, occurrence of the abnormal growth phenomenon as such may be suppressed.

The silane compound of the present disclosure may be added in a content of 0.001 to 1 wt %, based on the total weight of the etchant composition. Since the silane compound used in the present disclosure has two or more silane groups as described above, the silane compound as suggested in the present disclosure may effectively protect a silicon oxide film even in the case of being added in a small amount to the etchant composition, thereby increasing etch selectivity of the nitride to the oxide film. Specifically, when the use amount of the silane compound is less than 0.001 wt %, it is difficult to obtain an effect of high selectivity of the nitride film to the oxide film, and when the use amount is more than 1 wt %, the silane compound is gelled, which is not preferred. For example, the silane compound may be used at 0.001 to 0.7 wt %, 0.002 to 0.7 wt %, 0.002 to 0.5 wt %, 0.005 to 0.5 wt %, or the like.

The etchant composition of the present disclosure may further include the silane compound represented by the following Chemical Formula 2:

[Chemical Formula 2]

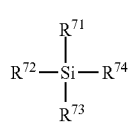

wherein $R^{71}$ to $R^{74}$ are independently hydrogen, hydrocarbyl, or heterohydrocarbyl.

The silane compound represented by Chemical Formula 2 may be included in a content of 0.005 to 1 wt %, based on the total weight of the etchant composition.

Furthermore, an ammonium salt may be added. The ammonium salt may prevent gelation of the etchant composition, and may be added in a content of 0.001 to 10 wt %, based on the total weight. When the ammonium salt is added at less than 0.001 wt %, a physical property improvement effect which decreases gelation is insignificant, and when added at more than 10 wt %, the ammonium salt may be the cause of gelation.

The ammonium salt is a compound having an ammonium ion, and those commonly used in the art to which the present disclosure pertains may be appropriately used in the present disclosure also. The ammonium salt may be, for example, ammonia water, ammonium chloride, ammonium acetate, ammonium phosphate, ammonium peroxydisulfate, ammonium sulfate, ammonium fluorate, or the like, but not limited thereto, and these may be used alone or in combination of two or more.

Furthermore, the etchant composition of the present disclosure may further include an optional additive commonly used in the art, for further improving etching performance. The additive may include a surfactant, a metal ion sequestrant, a corrosion inhibitor, or the like.

The etchant composition of the present disclosure is used for selectively removing a nitride film by etching from a semiconductor device including an oxide film and a nitride film, and the nitride film may include a silicon nitride film, for example, a SiN film, a SiON film, or the like.

In addition, the oxide film may be at least one film selected from the group consisting of a silicon oxide film, for example, a spin on dielectric (SOD) film, a high density plasma (HDP) film, a thermal oxide film, a borophosphate silicate glass (BPSG) film, a phosphosilicate glass (PSG) film, a borosilicate glass (BSG) film, a polysilazane (PSZ) film, a fluorinated silicate glass (FSG) film, a low pressure tetraethyl orthosilicate (LPTEOS) film, a plasma enhanced tetraethyl orthosilicate (PETEOS) film, a high temperature oxide (HTO) film, a medium temperature oxide (MTO) film, an undopped silicate glass (USG) film, a spin on glass (SOG) film, an advanced planarization layer (APL) film, an atomic layer deposition (ALD) film, a plasma enhanced oxide (Pe-oxide) film, an O3-tetraethyl orthosilicate (O3-TEOS) film, or combinations thereof.

An etching process using the etchant composition of the present disclosure may be performed by a wet etching method well-known in the art, for example, dipping, spraying, or the like.

Figure 2:
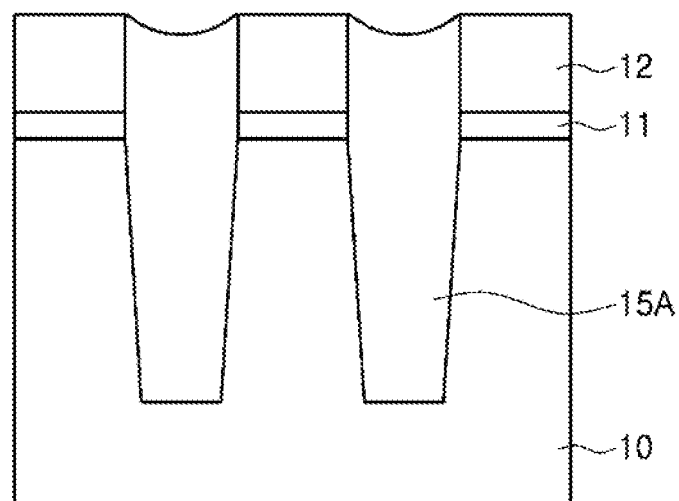

Examples of the etching process using the etchant composition of the present disclosure are schematically shown in FIGS. 1 and 2. FIGS. 1 and 2 are process sectional views showing a device separation process of a flash memory device, as an example.

First, as shown in FIG. 1, a tunnel oxide film 11, a polysilicon film 12, a buffer oxide film 13, and a pad nitride film 14 are formed in turn on a substrate 10, and then the polysilicon film 12, the buffer oxide film 13, and the pad nitride film 14 are selectively etched to form a trench. Subsequently, an SOD oxide film 15 is formed until the trench is gap-filled, and then a CMP process is carried out on the SOD oxide film 15 using the pad nitride film 14 as a polishing stop film.

Next, as shown in FIG. 2, the pad nitride film 14 is removed by wet etching using the etchant composition according to the present disclosure as described above, and then the buffer oxide film 13 is removed by a washing process. As a result, a device separation film 15A is formed in a field area.

During the etching process, a process temperature may be in a range of 50 to 300° C., preferably 100 to 200° C., more preferably 156 to 163° C., and an appropriate temperature may be changed as required considering other processes and other factors.

As such, according to a manufacturing method of a semiconductor device including the etching process which is carried out using the etchant composition of the present disclosure, when the nitride film and the oxide film is alternately stacked or mixed, it is possible to selectively etch the nitride film. In addition, particle occurrence which was problematic in the conventional etching process may be prevented to secure stability and reliability.

Accordingly, the method may be efficiently applied to various processes requiring selective etching of the nitride film to the oxide film in the semiconductor device manufacturing process.

EXAMPLE

Hereinafter, the present disclosure will be described in detail by way of examples. The following Examples relate to an example of the present disclosure, but the present disclosure is not limited thereto.

Synthesis Example 1

Silane Compound 1

A stirring bar was placed in a 250 ml round-bottom flask, a reflux condenser was installed therein, and 9.8 g of allyl ether, 100 ml of toluene, and 0.5 ml of a platinum (0)-1,3-divinyl-1,1,3,3-tetramethyldisiloxane complex solution (Pt ~2%) were added thereto.

37 g of trimethoxysilane was added and the temperature was raised to 50° C.

After stirring for 24 hours, the reactants were concentrated using a rotating concentrator.

The resulting product was filtered using silica gel and tetrahydrofuran, and dried under reduced pressure to give 30 g of Silane Compound 1 represented by the following formula:

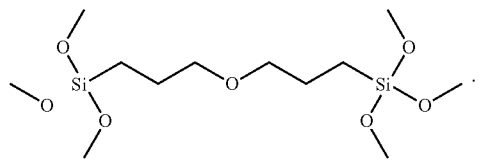

$^1$H-NMR (CDCl$_3$) 3.55 (s, 18H), 2.52 (t, J=7.0 Hz, 4H), 1.42 (qui, J=9.0 Hz, 4H), 0.58 (t, J=7.0 Hz, 4H)

Synthesis Example 2

Silane Compound 2

A stirring bar was placed in a 250 ml round-bottom flask, and 34 g of bis[(3-trimethoxysilyl)propyl]amine and 100 ml of dichloromethane were added thereto.

The reactants were cooled using an ice bath, and 0.6 g of acetic acid was slowly added thereto for 1 hour.

After completion of addition, the temperature was raised to normal temperature, the product was further stirred for 1 hour, and dried under reduced pressure to give 40 g of Silane Compound 2 represented by the following formula:

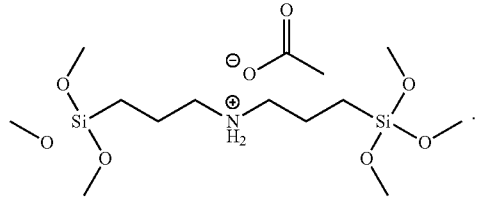

$^1$H-NMR (CDCl$_3$) 3.60 (s, 18H), 3.33 (t, J=7.0 Hz, 4H), 2.20 (s, 3H), 2.1 (qui, J=9.0 Hz, 4H), 0.60~0.55 (m, 4H)

Synthesis Example 3

Silane Compound 3

A stirring bar was placed in a 250 ml round-bottom flask, a reflux condenser was installed therein, and 20 g of 1,3-dibromopropane and 100 ml of toluene were added thereto.

52 g of 3-aminopropyltriisopropylsilane was added, the temperature was raised to 110° C., and the reactants were stirred for 24 hours.

After cooling to normal temperature, 10 g of triethylamine was added, and when a white solid is produced, the solid was removed with a filter, and the filtrate was dried under reduced pressure to obtain 45 g of Silane Compound 3 represented by the following formula:

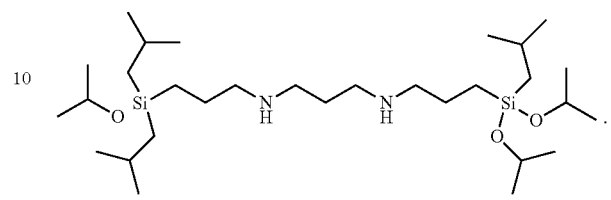

$^1$H-NMR (CDCl$_3$) 3.57 (qui, J=6.8 Hz, 6H), 2.62~2.50 (m, 8H), 2.0 (br, 2H), 1.58 (qui, J=7.0 Hz, 2H), 1.50 (qui, J=9.0 Hz, 4H), 1.24 (d, J=6.8 Hz, 36H), 0.60~0.55 (m, 4H)

Synthesis Example 4

Silane Compound 4

A stirring bar was placed in a 250 ml round-bottom flask, a Dean-Stark trap was installed therein, and 32 g of bis(trimethoxysilyl)hexane and 30 g of triethanolamine were added thereto.

100 ml of toluene was added, the temperature was raised to 90° C. to remove methanol, and the reactants were stirred for 24 hours.

After cooling to normal temperature, the produced solid was filtered, the solid was washed twice with 50 ml of normal hexane, and then dried under reduced pressure to give 40 g of Silane Compound 4 represented by the following formula:

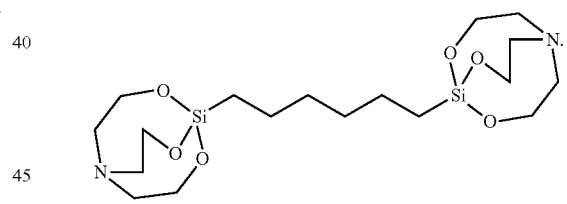

$^1$H-NMR (CDCl$_3$) 3.73 (t, J=5.5 Hz, 12H), 2.73 (t, J=5.5 Hz, 12H), 1.35~1.25 (m, 8H), 0.42 (m, 4H)

Synthesis Example 5

Silane Compound 5

A stirring bar was placed in a 250 ml round-bottom flask, a Dean-Stark trap was installed therein, and 38 g of N,N'-bis[(trimethoxysilyl)propyl]urea and 30 g of triethanolamine were added thereto.

100 ml of toluene was added, the temperature was raised to 90° C. to remove methanol, and the reactants were stirred for 24 hours.

After cooling to normal temperature, the produced solid was filtered, the solid was washed twice with 50 ml of normal hexane, and then dried under reduced pressure to give 43 g of Silane Compound 5 represented by the following formula:

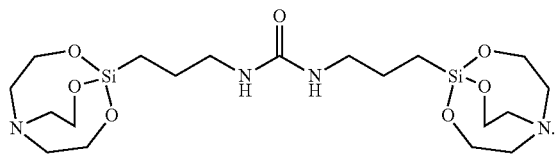 [SMILES: O=C(NCCC[Si]12OCCN(CCO1)CCO2)NCCC[Si]12OCCN(CCO1)CCO2]

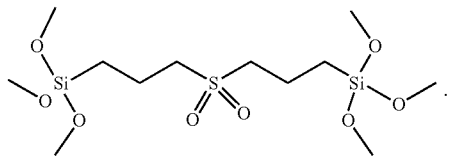

¹H-NMR (CDCl₃) 3.60 (s, 13H), 3.41 (t, J=7.0 Hz, 4H), 1.97~1.89 (m, 4H), 0.62~0.58 (m, 4H)

Synthesis Example 8

Silane Compound 8

A stirring bar was placed in a 250 ml round-bottom flask, a reflux condenser was installed therein, and 17 g of triallylphosphine oxide, 100 ml of toluene, and 0.5 ml of a platinum(0)-1,3-divinyl-1,1,3,3-tetramethyldisiloxane complex solution (Pt ~2%) were added thereto.

50 g of trimethoxysilane was added and the temperature was raised to 50° C.

After stirring for 24 hours, the reactants were concentrated using a rotating concentrator.

The resulting product was filtered using silica gel and tetrahydrofuran, and dried under reduced pressure to give 40 g of Silane Compound 8 represented by the following formula:

¹H-NMR (CDCl₃) 6.0 (br, 2H), 3.73 (t, J=5.5 Hz, 12H), 3.38 (t, J=7.0 Hz, 4H), 2.73 (t, J=5.5 Hz, 12H) 1.55~4.35 (m, 4H), 0.45 (m, 4H)

Synthesis Example 6

Silane Compound 6

A stirring bar was placed in a 250 ml round-bottom flask, and 15 g of 2,2'-(ethylenedioxy)bis(ethylamine) and 100 ml of dichloromethane were added thereto.

The reactants were cooled using an ice bath, and 44 g of 3-(triethoxysilyl)propyl isocyanate was slowly added thereto for 1 hour.

After completion of addition, the temperature was raised to normal temperature, the product was further stirred for 1 hour, and dried under reduced pressure to give 39 g of Silane Compound 6 represented by the following formula:

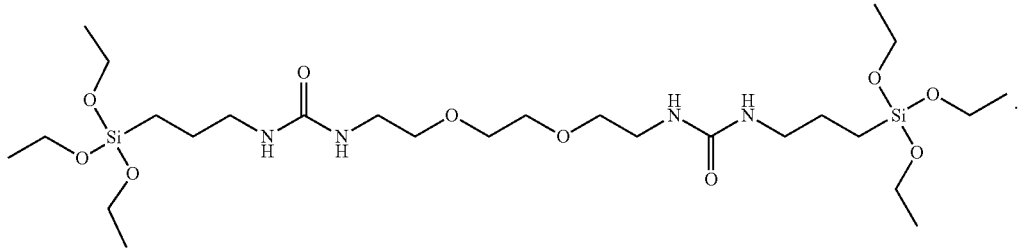 [SMILES: CCO[Si](CCCNC(=O)NCCOCCOCCNC(=O)NCCC[Si](OCC)(OCC)OCC)(OCC)OCC]

¹H-NMR (CDCl₃) 5.8 (br, 2H), 5.0 (br, 2H), 3.35~3.70 (m, 16H), 3.54 (s, 4H), 3.38 (t, J=7.0 Hz, 4H), 3.24 (t, J=7.0 Hz, 4H), 1.65~1.58 (m, 4H), 1.21 (t, J=7.0 Hz, 18H), 0.60~0.52 (m, 4H)

Synthesis Example 7

Silane Compound 7

A stirring bar was placed in a 250 ml round-bottom flask, a reflux condenser was installed therein, and 14 g of diallylsulfone, 100 ml of toluene, and 0.5ml of a platinum(0)-1,3-divinyl-1,1,3,3-tetramethyldisiloxane complex solution (Pt ~2%) were added thereto.

37 g of trimethoxysilane was added and the temperature was raised to 50° C.

After stirring for 24 hours, the reactants were concentrated using a rotating concentrator.

The resulting product was filtered using silica gel and tetrahydrofuran, and dried under reduced pressure to give 28 g of Silane Compound 7 represented by the following formula:

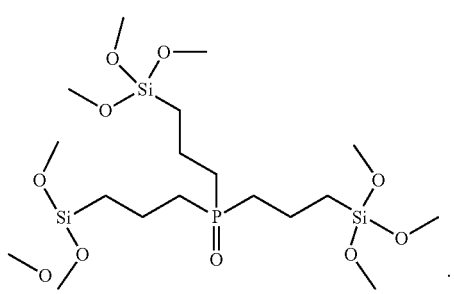

¹H-NMR (CDCl₃) 3.57 (s, 27H), 1.77~1.65 (m, 6H), 1.47~1.40 (m, 6H), 0.58 (t, J=7.1 Hz, 6H)

Examples 1 to 8 and Comparative Example 1

Each of Silane Compounds 1 to 8 obtained in Synthesis Examples 1 to 8 was added to 85% phosphoric acid and mixed therewith so that the content was 100 wt % as shown in Table 1, thereby preparing etchant solutions (Examples 1 to 8).

As comparative example, 0.5 wt % of 3-aminopropylsilanetriol (Comparative Silane Compound 1) was added to 99.5 wt % of 85% phosphoric acid and mixed therewith, thereby preparing an etchant solution (Comparative Example 1), as shown in Table 1.

A substrate in which a silicon nitride (SiN) film deposited at a thickness of 500 Å and a silicon oxide (SiOx) film deposited at a thickness of 5000 Å are formed on a semiconductor wafer was prepared.

The etchant solutions of Examples 1 to 8 and Comparative Example 1 including each of the silane compounds were added to a round flask, and when a temperature of 156° C. or 163° C. was reached, the silicon nitride film and the silicon oxide film were etched.

An etching speed was a value calculated by dividing a difference between a film thickness before treating each film and a film thickness after treating each film by etching by an etching time (minute), after etching the silicon nitride film for 720 seconds and the silicon oxide film for 6000 seconds, and the thin film thickness was measured using an ellipsometer (NANO VIEW, SEMG-1000).

A selection ratio represents a ratio of an etching speed of the nitride film to an etching speed of the oxide film.

Example 9

Silane Compound 3 obtained in Synthesis Example 3 was added to 85% phosphoric acid and mixed therewith so that the content was 100 wt % as shown in Table 1, thereby preparing an etchant solution (Example 9).

The etchant solution of Example 9 was used to etch the silicon nitride film and the silicon oxide film in the same manner as in Example 1 on the same substrate as Example 1.

A selection ratio was measured in the same manner as in Example 1, and the results are shown in Table 1.

tive Example 1 had a high etching speed of the silicon oxide film, thereby having a lower selection ratio.

The etchant composition according to the present disclosure having a high etching selection ratio of a nitride film to an oxide film, by including a silane compound which is reacted with a surface of an oxide film to form a protective film capable of protecting the oxide film.

In addition, use of the etchant composition of the present disclosure prevents damage of film quality of the oxide film when removing the nitride film or deterioration of electrical properties due to etching of the oxide film, thereby improving device characteristics.

In particular, the present disclosure uses a silane compound including 2 or more silanes, thereby obtaining an excellent selection ratio even with addition of a small amount.

While exemplary embodiments have been shown and described above, it will be apparent to those skilled in the art that modifications and variations could be made without departing from the scope of the present invention as defined by the appended claims.

What is claimed is:

1. An etchant composition comprising: phosphoric acid and a silane compound represented by the following Chemical Formula 1:

[Chemical Formula 1]

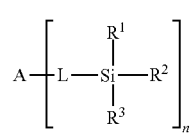

TABLE 1

| | Composition | Process temperature (° C.) | SiN E/R (Å/min) | SiO E/R (Å/min) | Selection ratio |
|---|---|---|---|---|---|
| Comparative Example 1 | Phosphoric acid (99.5 wt %) + Comparative Silane Compound 1 (0.5 wt %) | 158 | 68.3 | 0.32 | 213 |
| Example 1 | Phosphoric acid (99.5 wt %) + Silane Compound 1 (0.5 wt %) | 158 | 91.3 | 0.14 | 652 |
| Example 2 | Phosphoric acid (99.5 wt %) + Silane Compound 2 (0.5 wt %) | 158 | 93.7 | 0.13 | 720 |
| Example 3 | Phosphoric acid (99.5 wt %) + Silane Compound 3 (0.5 wt %) | 158 | 92.8 | 0.09 | 1031 |
| Example 4 | Phosphoric acid (99.5 wt %) + Silane Compound 4 (0.5 wt %) | 158 | 83.7 | 0.13 | 644 |
| Example 5 | Phosphoric acid (99.5 wt %) + Silane Compound 5 (0.5 wt %) | 158 | 90.5 | 0.12 | 754 |
| Example 6 | Phosphoric acid (99.5 wt %) + Silane Compound 6 (0.5 wt %) | 158 | 87.3 | 0.16 | 545 |
| Example 7 | Phosphoric acid (99.5 wt %) + Silane Compound 7 (0.5 wt %) | 158 | 82.1 | 0.20 | 410 |
| Example 8 | Phosphoric acid (99.5 wt %) + Silane Compound 8 (0.5 wt %) | 158 | 91.5 | 0.11 | 831 |
| Example 9 | Phosphoric acid (99.998 wt %) + Silane Compound 3 (0.002 wt %) | 158 | 91.5 | 0.15 | 610 |

As shown in Table 1 above, in Examples 1 to 9, a multi-silane compound having two or more silane groups was used as the additive of the etchant solution, whereby the silicon oxide film was hardly etched and the silicon nitride film was selectively etched to result in a high selection ratio. However, the monosilane compound additive of Comparawherein A is an n-valent radical, L is $C_1$-$C_5$ hydrocarbylene, $R^1$ to $R^3$ are independently hydrogen, hydroxy, hydrocarbyl, or alkoxy, in which $R^1$ to $R^3$ exist respectively or are connected to each other by a heteroelement, and n is an integer of 2 to 4.

2. The etchant composition of claim 1, wherein $R^1$ to $R^3$ are independently $C_1$-$C_{20}$ alkoxy or $R^1$ to $R^3$ are $C_1$-$C_{20}$ alkoxy connected to each other by a nitrogen.

3. The etchant composition of claim 1, wherein A is $C_1$-$C_{20}$ hydrocarbylene, a radical having N as a binding site, a radical having O as a binding site, a radical having S as a binding site, a radical having P as a binding site, or an amine salt radical.

4. The etchant composition of claim 3, wherein the $C_1$-$C_{20}$ hydrocarbylene is $C_1$-$C_{20}$ alkylene or $C_6$-$C_{20}$ arylene.

5. The etchant composition of claim 3, wherein the radical having N as a binding site is *—$NR^4$—*, *—$NR^{15}CSNR^{16}$—*, *—$NR^{17}CONR^{18}$—*, *—$NR^{19}L_1NR^{20}$—*, *—$NR^{21}CONR^{22}L_2NR^{23}CONR^{24}$—*, *—$NR^{25}CONL_3L_4NCONR^{26}$—*,

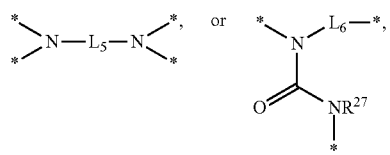

wherein $R^{14}$ to $R^{27}$ are independently hydrogen, $C_1$-$C_{20}$ alkyl or $C_6$-$C_{20}$ aryl, $L_1$ to $L_5$ are $C_1$-$C_{20}$ alkylene, $C_6$-$C_{20}$ arylene, or $R^{41}(OR^{42})p$, wherein $R^{41}$ and $R^{42}$ are independently $C_1$-$C_{20}$ alkylene, and p is an integer of 1 to 5, and $L_6$ is a direct bond or $(CH_2)qNR^{43}NR^{44}$, wherein $R^{43}$ and $R^{44}$ are independently hydrogen, $C_1$-$C_{20}$ alkyl, or $C_6$-$C_{20}$ aryl, and q is an integer of 1 to 5.

6. The etchant composition of claim 3, wherein the radical having O as a binding site is *—O—*.

7. The etchant composition of claim 3, wherein the radical having S as a binding site is *—S—*, *—S—S—*,

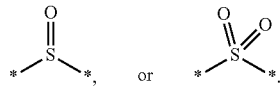

8. The etchant composition of claim 3, wherein the radical having P as a binding site is

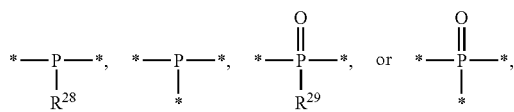

wherein $R^{28}$ and $R^{29}$ are independently hydrogen, $C_1$-$C_{20}$ alkyl, $C_6$-$C_{20}$ aryl, $C_1$-$C_{20}$alkoxy, or $C_1$-$C_{20}$alkyl$C_1$-$C_{20}$alkoxy.

9. The etchant composition of claim 3, wherein the amine salt radical is *—$N^+(R^{11}R^{12})X_3^-$—* or

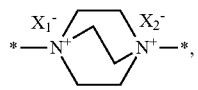

wherein $R^{11}$ and $R^{12}$ are independently hydrogen, $C_1$-$C_{20}$ alkyl or $C_6$-$C_{20}$ aryl, and $X_1$ to $X_3$ are independently halogen or a $C_1$-$C_{20}$ alkylcarbonate group.

10. The etchant composition of claim 1, wherein n is 2.

11. The etchant composition of claim 1, wherein the silane compound is at least one selected from the following Structural Formulae 1 to 38:

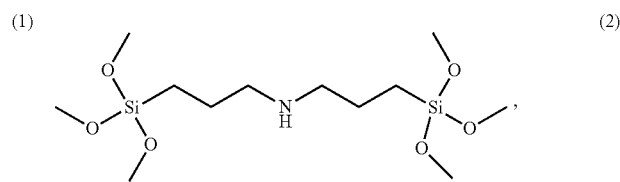

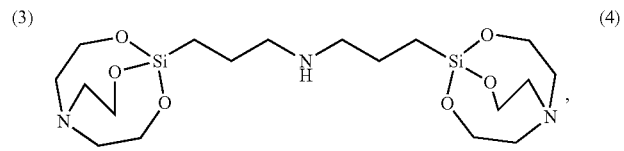

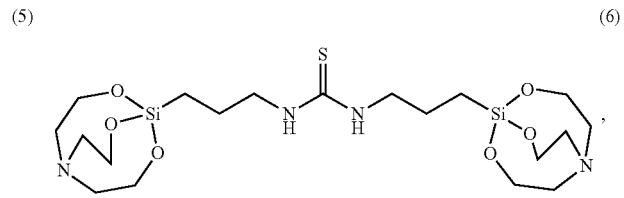

-continued
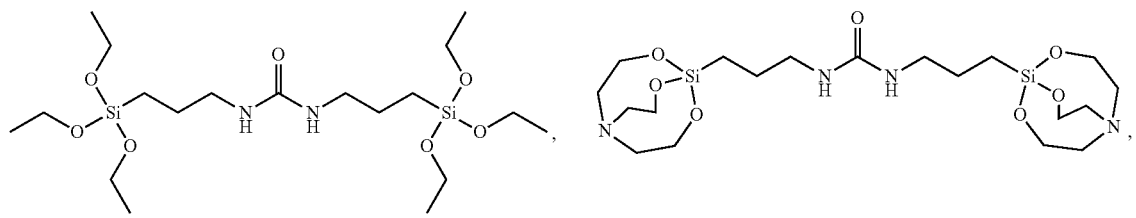
(7)
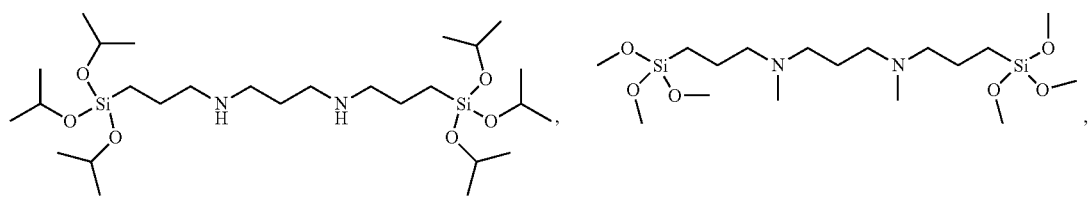
(8)
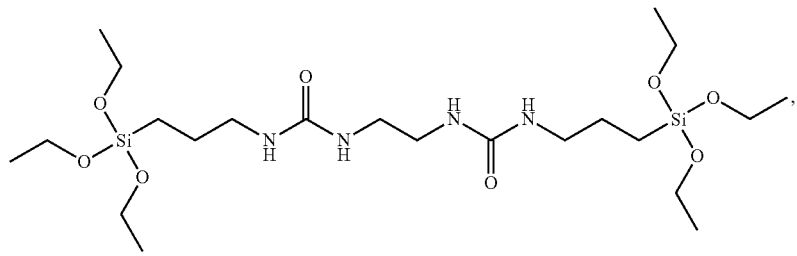
(9)
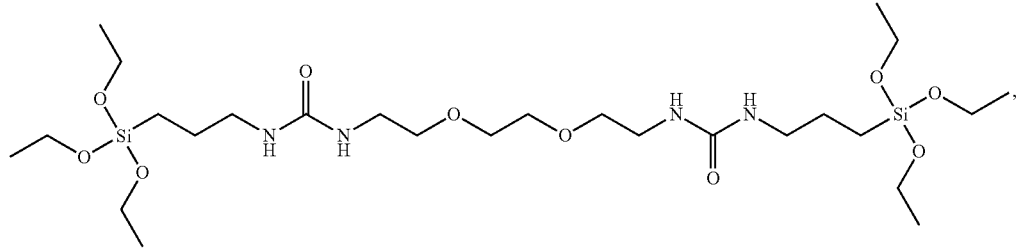
(10)
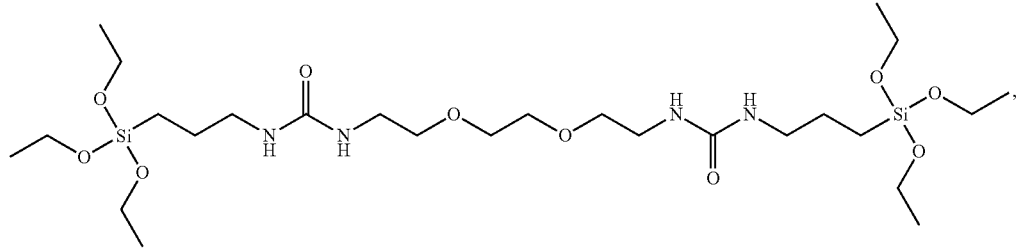
(11)
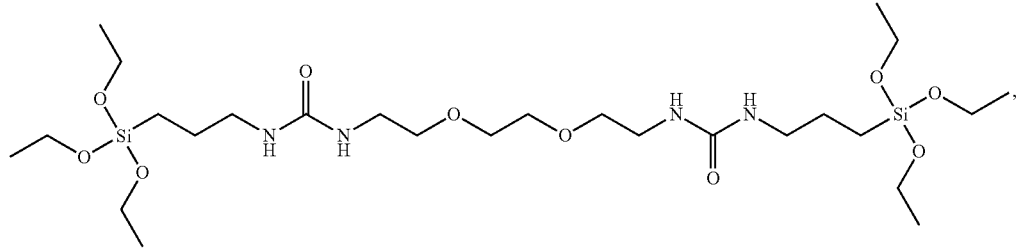
(12)
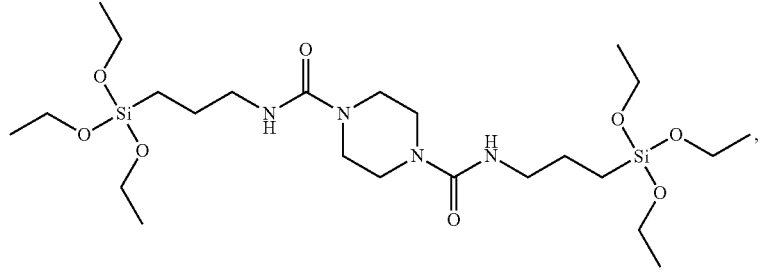
(13)
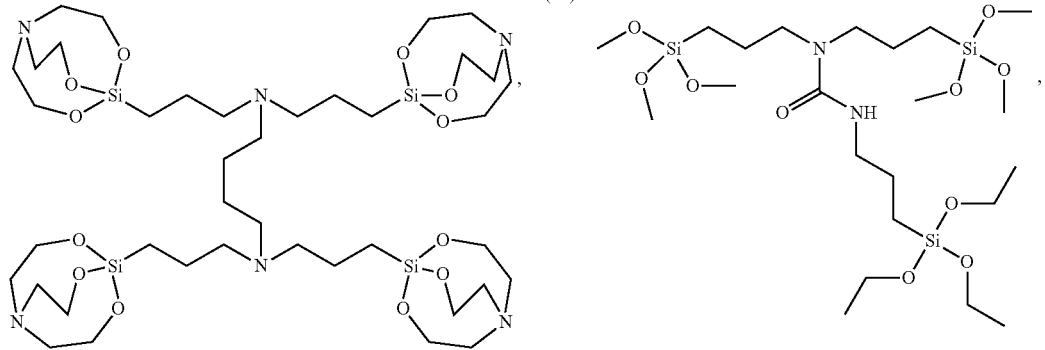
(14)
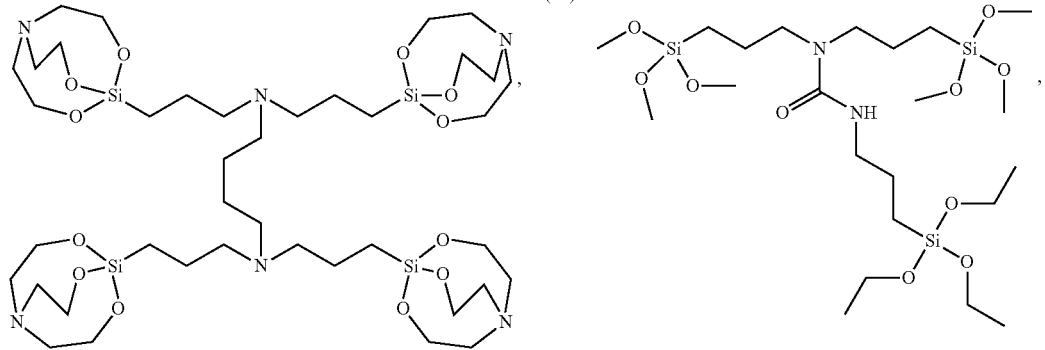
(15)

(16) 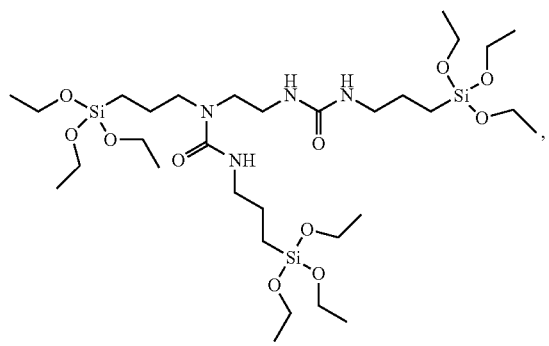
(17) 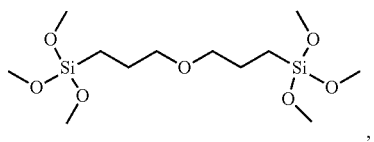
(18) 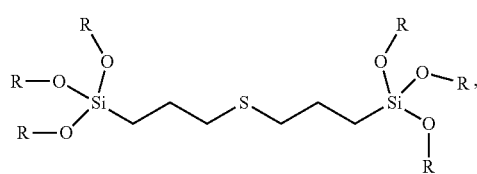
(19) 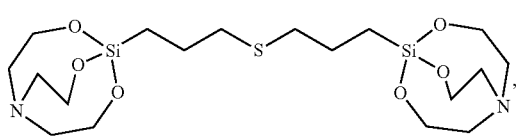
(20) 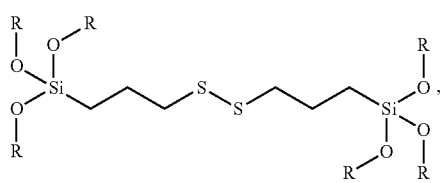
(21) 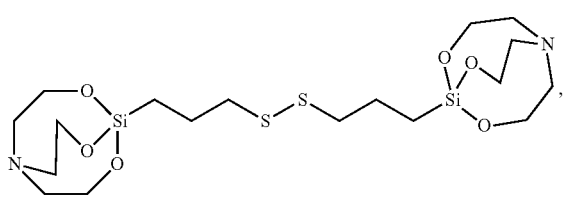
(22) 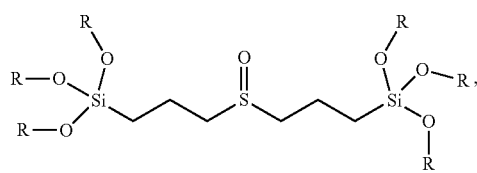
(23) 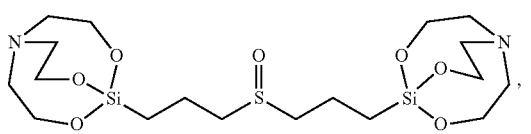
(24) 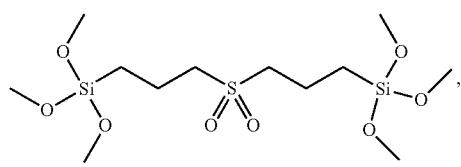
(25) 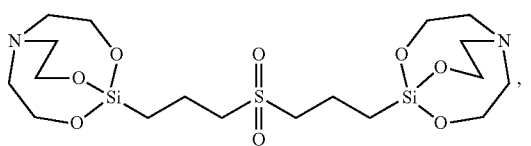
(26) 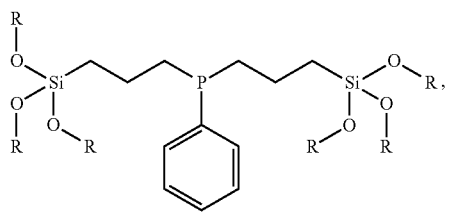
(27) 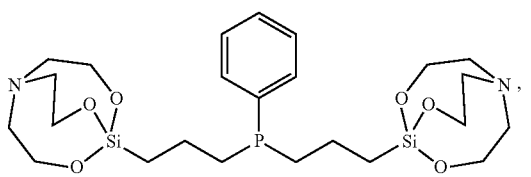
(28) 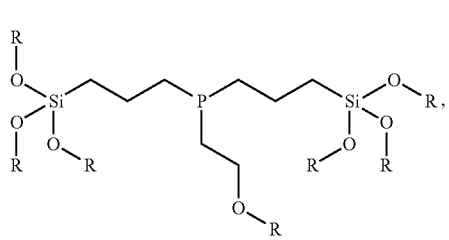
(29) 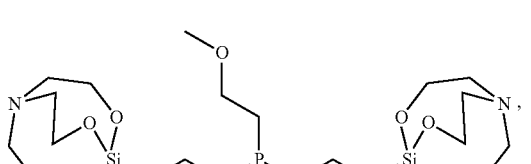

-continued

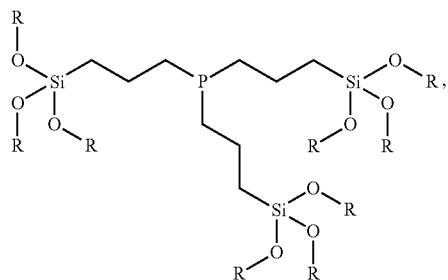 (30)

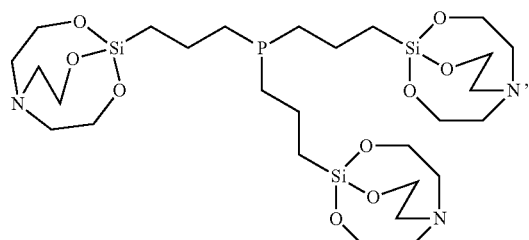 (31)

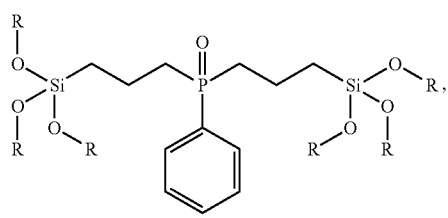 (32)

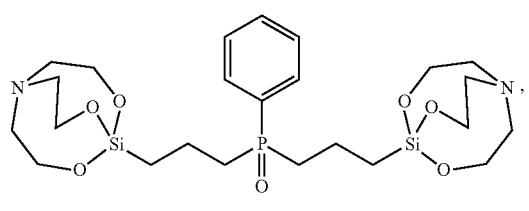 (33)

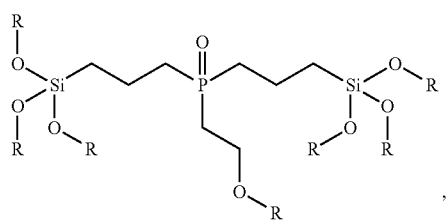 (34)

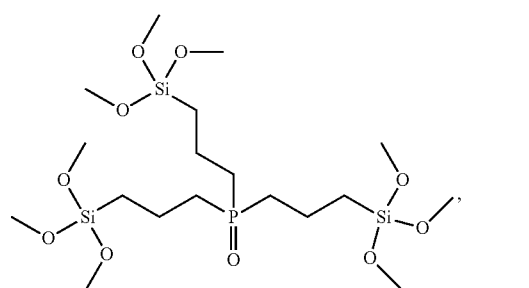 (35)

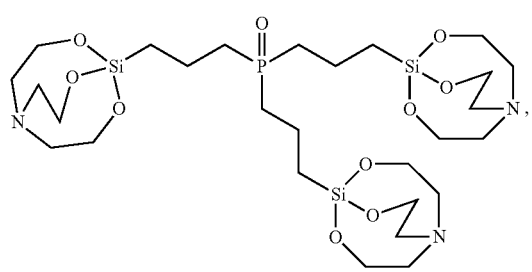 (36)

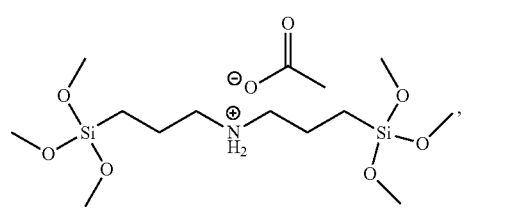 (37)

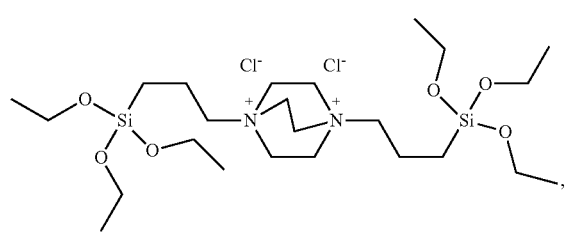 (38)

wherein R is hydrogen, $C_1$-$C_{20}$ alkyl, or $C_6$-$C_{20}$ aryl.

12. The etchant composition of claim 1, wherein the silane compound is included at 0.001 to 1 wt %, with respect to the entire etchant composition.

13. The etchant composition of claim 12, further comprising a silane compound represented by the following Chemical Formula 2:

[Chemical Formula 2]

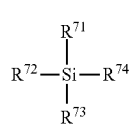

wherein $R^{71}$ to $R^{74}$ are independently hydrogen, hydrocarbyl, or heterohydrocarbyl.

14. The etchant composition of claim 13, further comprising an ammonium salt.

15. A silane compound represented by the following Chemical Formula 1:

[Chemical Formula 1]

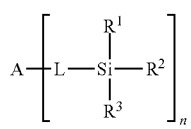

wherein
$R^1$ to $R^3$ are independently hydrogen, hydroxy, hydrocarbyl, or alkoxy, in which $R^1$ to $R^3$ exist respectively or are connected to each other by a heteroelement, and
L is $C_1$-$C_5$ hydrocarbylene,
n is an integer of 2 to 4,
A is *—$N^{30}$ $R^{11}R^{12}X_3^-$—*,

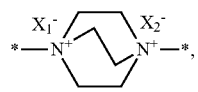

*—$NR^{19}L_1NR^{20}$—*, *—$NR^{21}CONR^{22}L_2NR^{23}CONR^{24}$—*,

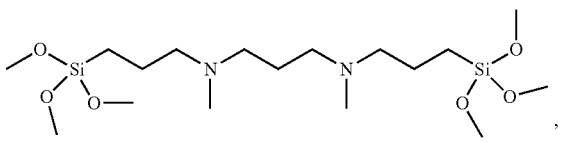

wherein $R^{11}$, $R^{12}$, $R^{19}$ to $R^{24}$ and $R^{27}$ are independently hydrogen, $C_1$-$C_{20}$ alkyl, or $C_6$-$C_{20}$ aryl,
$X_1$ to $X_3$ are independently halogen or a $C_1$-$C_{20}$ alkylcarbonate group,
$L_1$ and $L_5$ are $C_1$-$C_{20}$ alkylene or $C_6$-$C_{20}$ arylene,
$L_2$ is $C_1$-$C_{20}$ alkylene, $C_6$-$C_{20}$ arylene, or $R^{41}(OR^{42})_p$, wherein $R^{41}$ and $R^{42}$ are $C_1$-$C_{20}$ alkylene, and p is an integer of 1 to 5, and
$L_6$ is a direct bond or $(CH_2)qNR^{43}CONR^{44}$, wherein $R^{43}$ and $R^{44}$ are independently hydrogen, $C_1$-$C_{20}$ alkyl, or $C_6$-$C_{20}$ aryl, and q is an integer of 1 to 5.

16. The silane compound of claim 15, wherein the silane compound represented by Chemical Formula 1 is selected from compounds represented by the following structural formulae:

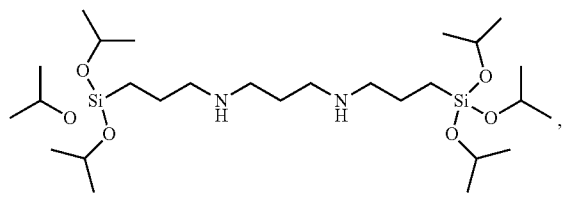

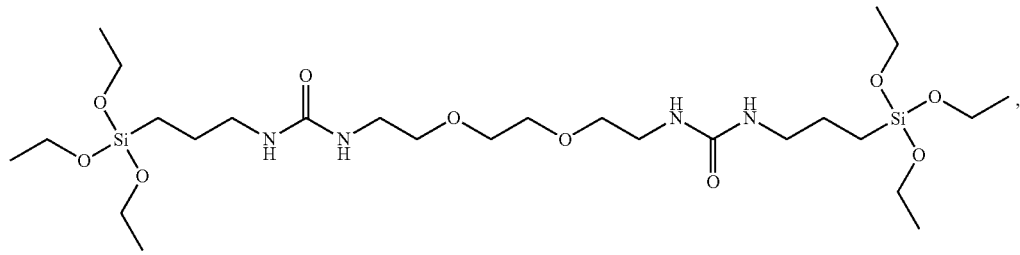

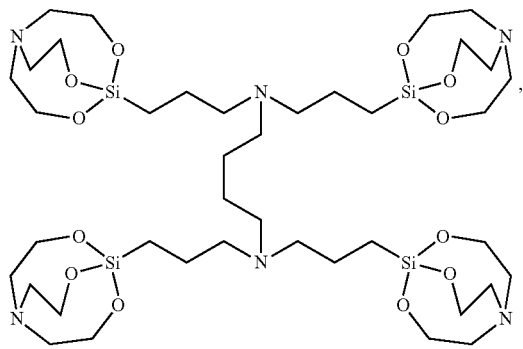

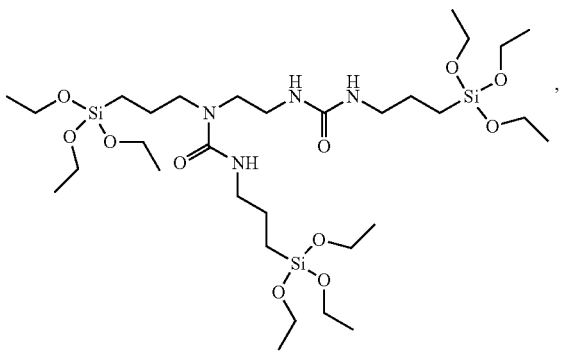

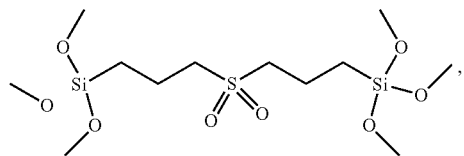
(24)
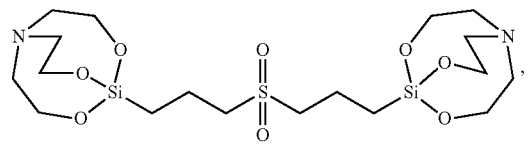
(25)
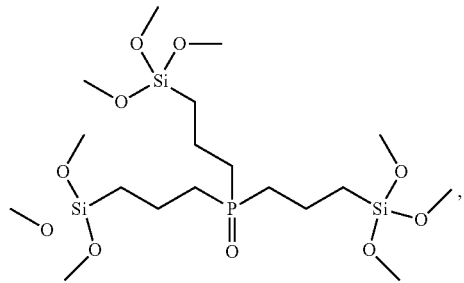
(35)
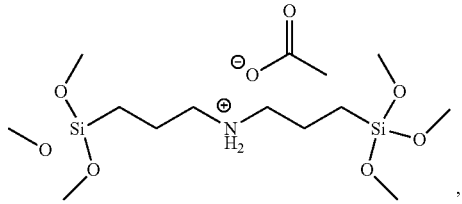
(37)
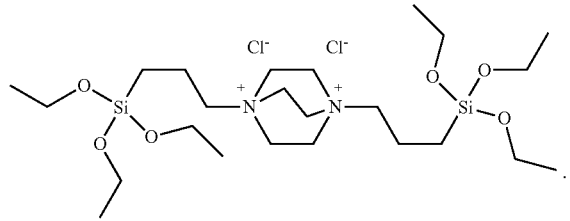
(38)
* * * * *